(12) United States Patent
Poirier et al.

(10) Patent No.: US 6,954,706 B2
(45) Date of Patent: Oct. 11, 2005

(54) METHOD FOR MEASURING INTEGRATED CIRCUIT PROCESSOR POWER DEMAND AND ASSOCIATED SYSTEM

(75) Inventors: Christopher A. Poirier, Fort Collins, CO (US); Samuel D. Naffziger, Fort Collins, CO (US); Christopher J. Bostak, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 62 days.

(21) Appl. No.: 10/644,376

(22) Filed: Aug. 20, 2003

(65) Prior Publication Data

US 2005/0043909 A1 Feb. 24, 2005

(51) Int. Cl.$^7$ .............................................. G06F 19/00
(52) U.S. Cl. .......................... 702/65; 702/57; 702/60; 702/64; 702/69; 702/124
(58) Field of Search .............................. 702/57, 60, 64, 702/65, 69, 124; 324/130; 327/554, 558; 318/685, 696; 331/44, 46–48, 65, 66, 116 R, 158, 176, 177 R, 177 V

(56) References Cited

U.S. PATENT DOCUMENTS

| | | | | |
|---|---|---|---|---|
| 4,623,838 A | * | 11/1986 | Nakamura | 324/142 |
| 4,746,879 A | * | 5/1988 | Ma et al. | 331/44 |
| 4,792,768 A | * | 12/1988 | Fried et al. | 331/11 |
| 4,962,380 A | * | 10/1990 | Meadows | 341/120 |
| 5,179,358 A | * | 1/1993 | Martin | 331/1 A |
| 5,276,376 A | * | 1/1994 | Puskas | 310/317 |
| 5,367,202 A | * | 11/1994 | Yee | 327/540 |
| 5,724,591 A | * | 3/1998 | Hara et al. | 713/322 |
| 5,740,525 A | * | 4/1998 | Spears | 455/259 |
| 5,912,595 A | * | 6/1999 | Ma et al. | 331/117 D |
| 6,160,459 A | * | 12/2000 | Sakurai et al. | 331/158 |
| 6,448,798 B1 | | 9/2002 | Shinmori | |
| 6,564,332 B1 | | 5/2003 | Nguyen et al. | |
| 6,630,872 B1 | * | 10/2003 | Lanoue et al. | 331/176 |
| 6,710,644 B2 | * | 3/2004 | Duncan et al. | 327/558 |
| 6,784,756 B2 | * | 8/2004 | Villella | 331/176 |
| 2002/0130712 A1 | | 9/2002 | Naffziger et al. | |
| 2003/0184399 A1 | * | 10/2003 | Lanoue et al. | 331/176 |

FOREIGN PATENT DOCUMENTS

JP      2004062727      2/2004

OTHER PUBLICATIONS

Foreing Search Report issued for GB 0 41 7995.8, dated Dec. 21, 2004.
U.S. Appl. No. 10/644,559, Bostak et al.
U.S. Appl. No. 10/644,542, Bostak et al.
U.S. Appl. No. 10/644,625, Poirier et al.

* cited by examiner

Primary Examiner—Carol S. W. Tsai

(57) ABSTRACT

A system and method for measuring integrated circuit processor power demand comprises calibrating one or more voltage controlled oscillators for use as ammeters, calibrating a calibration current source, wherein the calibration current source draws current through a inherent resistance, calibrating the inherent resistance, and interleaving said calibrations in time with calculating the processor power demand using a voltage that is measured across the inherent resistance.

34 Claims, 5 Drawing Sheets

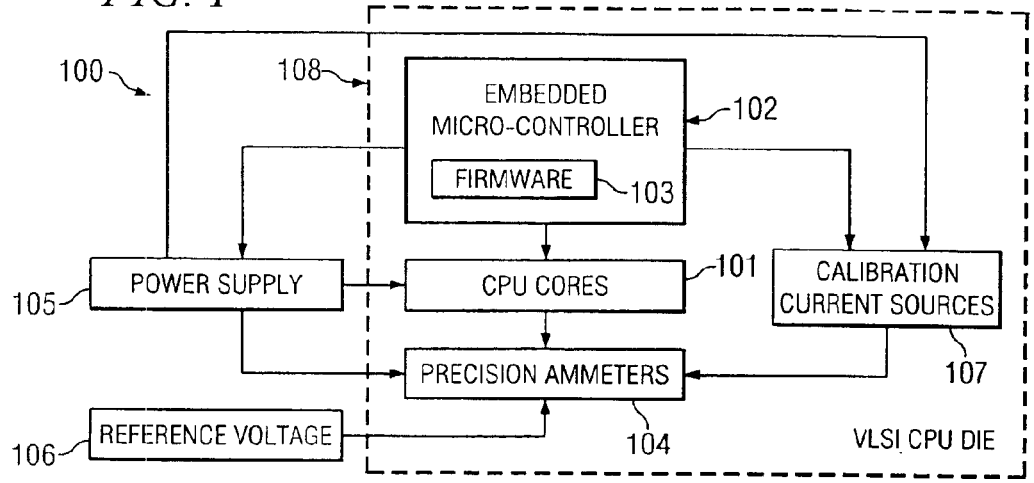
FIG. 1
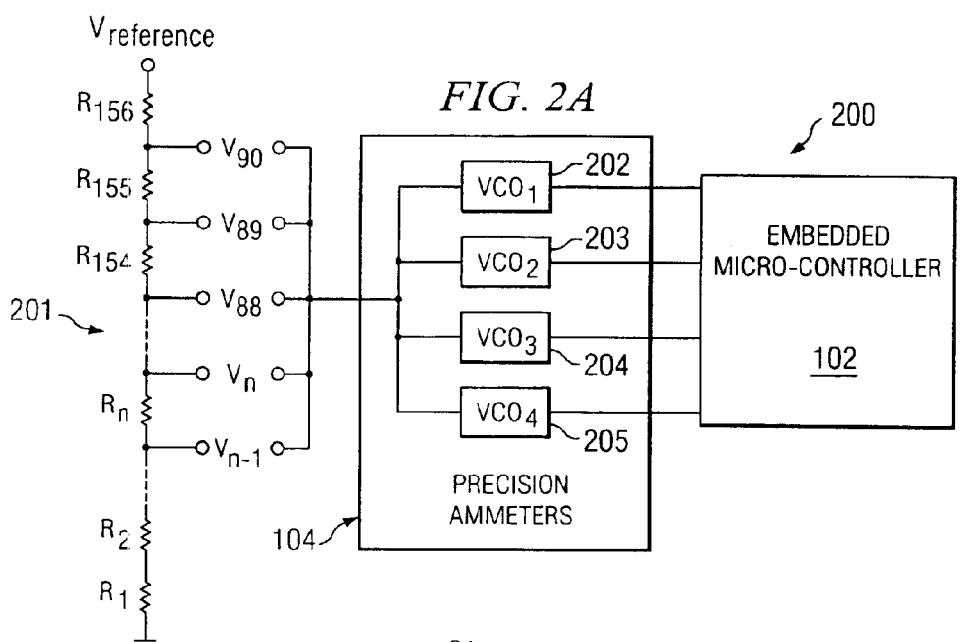
FIG. 2A
FIG. 2B

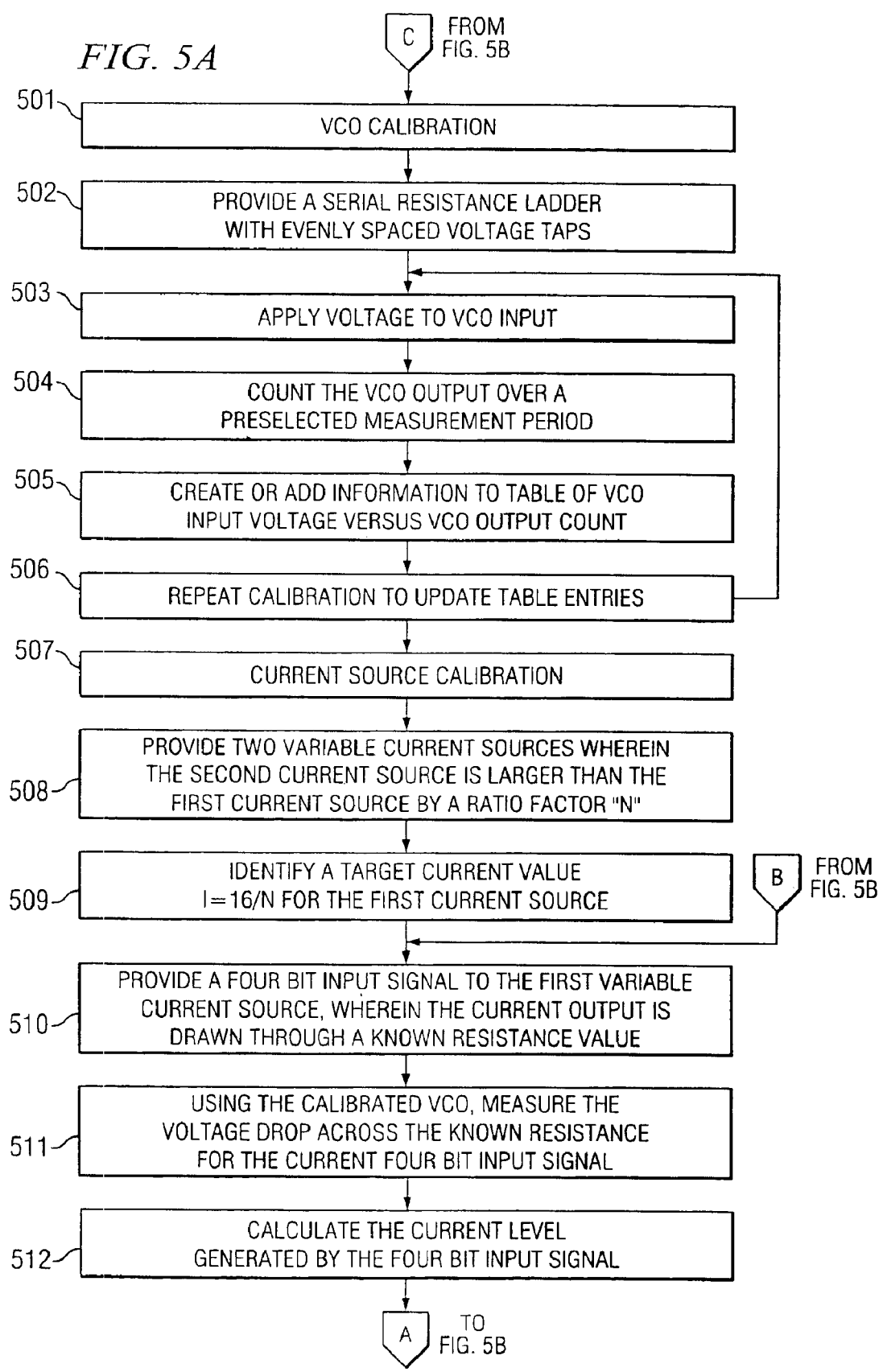

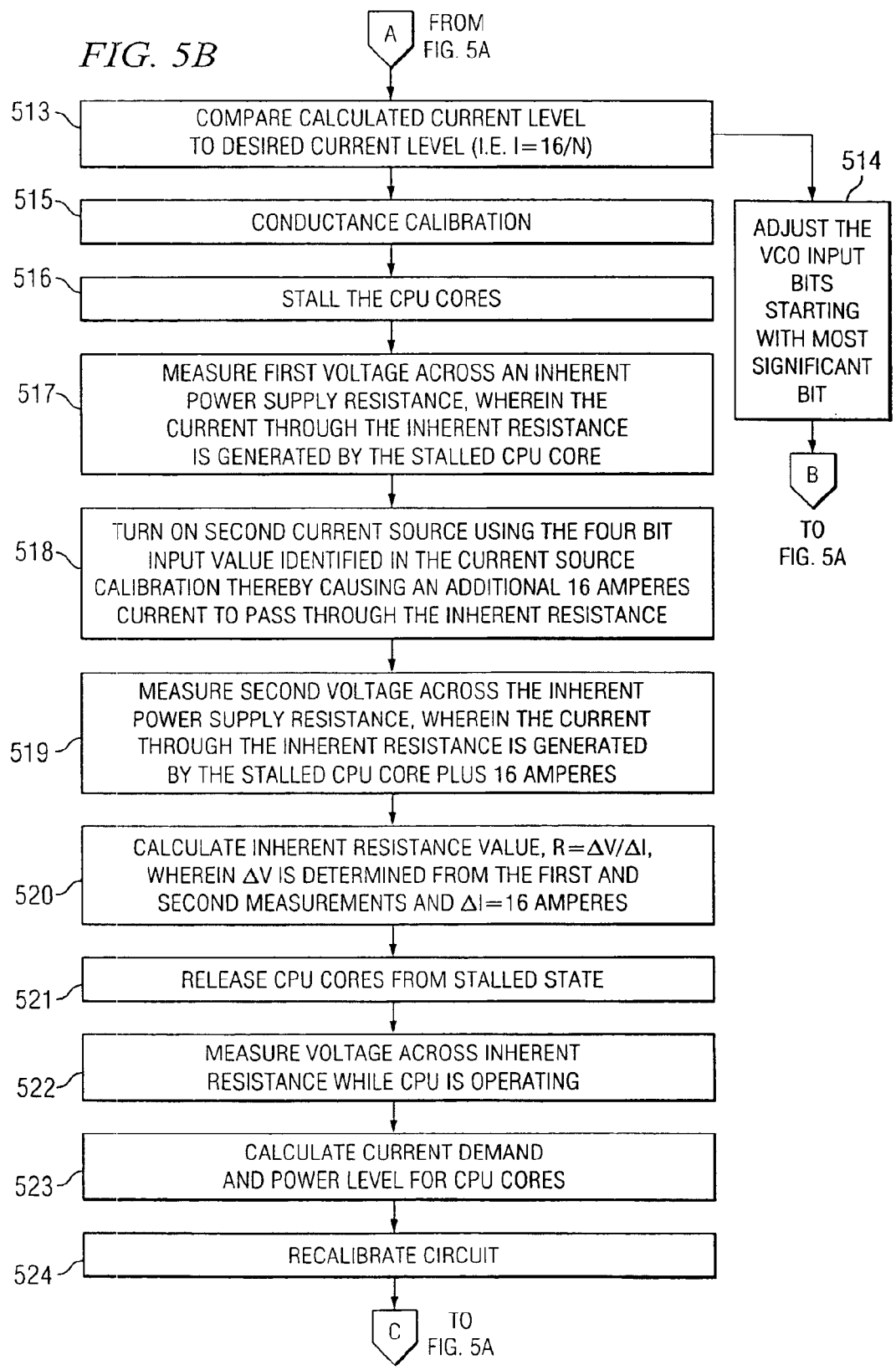

METHOD FOR MEASURING INTEGRATED CIRCUIT PROCESSOR POWER DEMAND AND ASSOCIATED SYSTEM

CROSS-REFERENCE TO RELATED APPLICATIONS

This application is related to U.S. patent application Ser. No. 10/645,559, entitled "METHOD AND SYSTEM FOR CALIBRATION OF A VOLTAGE CONTROLLED OSCILLATOR (VCO);" U.S. patent application Ser. No. 10/644,542, entitled "SYSTEM AND METHOD FOR MEASURING CURRENT;" and U.S. patent application Ser. No. 10/644,625, entitled "A SYSTEM FOR AND METHOD OF CONTROLLING A VLSI ENVIRONMENT;" filed concurrently herewith, the disclosures of which are hereby incorporated by reference herein in their entirety.

BACKGROUND

Ammeters can be used to measure the current consumption of an integrated circuit CPU. Traditionally, a precision resistor is used in the power supply grid and the voltage drop across the precision resistor is measured. Using the known precision resistor value and the measured voltage drop, the CPU's current draw and power level can be calculated. The introduction of the precision resistor into the power supply grid wastes power since the precision resistor is always there even when the CPU's current draw is not being measured.

It is important that the precision resistor have a high level of stability across a range of temperatures and currents so that accurate measurements can be made. The use of such a precision resistor adds to the overall costs of the CPU. It is also important that the voltmeter that is utilized to measure the voltage drop be initially calibrated and stable across a range of temperatures.

SUMMARY

Embodiments of the invention include a method for measuring integrated circuit processor power demand comprising calibrating one or more voltage controlled oscillators (VCOs) for use as ammeters, calibrating a calibration current source, wherein the calibration current source draws current through a inherent resistance, calibrating calculating the inherent resistance, and calculating the processor power demand using a voltage that is measured across the inherent resistance.

Embodiments of the invention also include a system for calibrating measurements in a processor integrated circuit die, comprising at least one voltage controlled oscillator (VCO), a resistive ladder having a plurality of voltage taps, wherein the voltage taps are connectable to the VCO, and a controller coupled to the output of the VCO, wherein the controller maintains a calibration table of VCO output counts for selected voltage inputs, wherein the at least one VCO, the resistive ladder and the controller are constructed on the same die as the processor integrated circuit.

Embodiments of the invention further includes a computer program product comprising a computer usable medium having computer readable program code embedded therein, the computer readable program code comprising code for calibrating one or more voltage controlled oscillators for use as ammeters, code for calibrating a calibration current source, wherein the calibration current source draws current through a inherent resistance, code for calibrating the inherent resistance, and code for calculating the processor integrated circuit power demand using a voltage that is measured across the inherent resistance.

BRIEF DESCRIPTION OF THE DRAWINGS

FIG. 1 is a simplified, high-level block diagram of a VLSI CPU die;

FIG. 2A illustrates an exemplary embodiment of a circuit for calibrating VCOs used as precision ammeters;

FIG. 2B illustrates a calibration table for precision VCOs used in embodiments of the present invention;

FIGS. 5A and 5B are a flowchart illustrating a three-level process for calibrating measurements in a large VLSI CPU.

DETAILED DESCRIPTION

Figure 3:
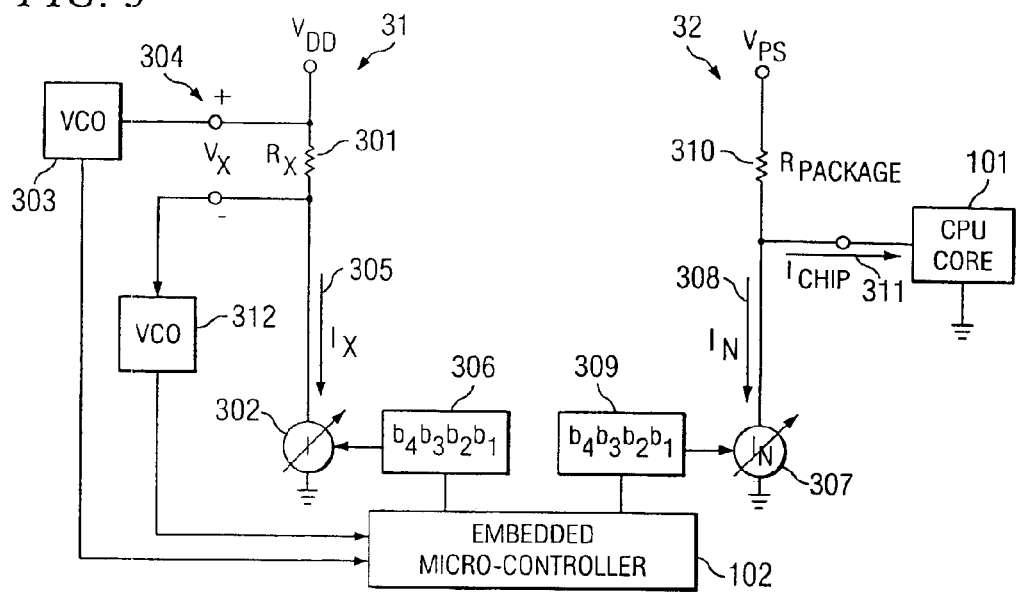
FIG. 3 is a schematic diagram of a current source calibration circuit.

One or more precision ammeters are constructed on an integrated circuit die along with a large CPU. The present invention provides a system and method for performing continuous calibration of the embedded ammeters that are on the CPU die. A micro-controller embedded on the CPU die is used to control the VLSI environment of the integrated circuit. The micro-controller uses the precision ammeters to measure voltage and current at various locations on the integrated circuit and its packaging. The micro-controller routinely performs calibration operations to ensure that it is making accurate measurements and calculations. For example, the micro-controller measures the voltage drop across a parasitic resistance to measure CPU power levels. Due to variations in temperature, the parasitic resistance may change over time. Additionally, the ammeter itself may drift over time or may vary over a temperature range. The micro-controller compensates for these variations by continuously calibrating the ammeters and continuously updating the parasitic resistance value that is used in the calculations to determine the CPU current consumption.

FIG. 1 is a simplified, high-level block diagram of VLSI CPU system 100. CPU cores 101 may consist of one or more processor cores. Embedded, on-die micro-controller 102 monitors the integrated circuit and the VLSI environment and controls the environment to optimize the CPU's performance. The functions and operations of embedded micro-controller 102 are discussed in co-pending U.S. patent application Ser. No. 10/644,625 entitled "A SYSTEM FOR AND METHOD OF OPTIMIZING THE VLSI ELECTRICAL AND THERMAL ENVIRONMENT OF A LARGE CPU DIE USING AN ON-DIE EMBEDDED MICRO-CONTROLLER" the disclosure of which is incorporated by reference herein. Firmware 103 includes optimization algorithms and routines that are used by micro-controller 102 to control the VLSI environment of CPU die 100.

Micro-controller 102 uses precision ammeters 104 to monitor current and power consumption by CPU 101. In a preferred embodiment, precision ammeters 104 comprise one or more Voltage Controlled Oscillators (VCOs). The VCOs are high speed oscillators that are sensitive to input voltage. In response to an input voltage, the VCO generates a stream of pulses. In a preferred embodiment, the nominal frequency of the VCOs is on the order of 25 GHz, which provides a sufficient number of pulses over a very short sample period, such as 8 microseconds, so that variations in voltages can be detected. The count or frequency of the VCO output varies in proportion to the input voltage. As the input voltage increases, the VCO output count, which is measured over a set period of time, also increases. Micro-controller 102 monitors the count of the VCOs and uses that information to monitor the VLSI environment. In one embodiment, each of the VCOs in ammeter 104 may be used to monitor current consumption in different portions of system 100 including VLSI CPU die 108.

Power supply 105 provides power to CPU cores 101 and calibration current sources 107. Micro-controller 102 monitors power supply 105 using precision ammeters 104 and may control power supply 105 to increase or decrease the power available to CPU cores 101. In this way, micro-controller 102 can adjust the power parameters in the VLSI environment, for example, to compensate for a high-temperature condition or a low power condition detected in CPU cores 101.

Ammeters 104 vary by die, by temperature, and with age. Two separate VCOs constructed on the same die may react differently to the same input voltage. Also, the VCO output is non-linear and varies at different frequency rates at different voltages and temperatures. To get accurate readings from ammeters 104, the VCO must be continuously calibrated to compensate for changes over time. However, a complete VCO calibration must not consume too much time which would interfere with the ammeters' ability to monitor voltages within CPU 101.

The VCOs may be calibrated using precision voltage inputs to build a non-linear curve of count (output) v. voltage. Ninety voltage inputs derived from reference voltage 106 are separately applied to each VCO input, and micro-controller 102 monitors the output count for a set period of time, such as 8 microseconds. Micro-controller 102 uses these output counts to build a table of count v. voltages for each VCO.

FIG. 2A illustrates an exemplary embodiment of circuit 200 for calibrating VCOs 202–205 of precision ammeters 104. Resistance ladder 201 is a series of 156 identical precision resistors that are constructed on the VLSI die. The resistors in ladder 201 connect voltage $V_{reference}$ to ground. This creates a series of evenly stepped voltages across each resistor. For example, the voltage drop across resistor $R_{156}$ is the same as the voltage drop across resistor $R_1$. The voltages across each resistor add up to the voltage $V_{reference}$. Voltage taps $V_{90}$, $V_{89}$, $V_{88}$ etc. are evenly stepped. These voltages can be successively applied as the input to VCOs 202–205 in precision ammeter 104. The output count of VCOs 202–205 will vary for each input voltage. Micro-controller 102 monitors the output of VCOs 202–205 and counts the output pulses over a 8 microsecond sample window. Micro-controller 102 steps through the ninety available voltage values and observes the associated output count for each VCO. Using this data, micro-controller 102 builds a calibration table. FIG. 2B illustrates calibration table 20 for precision VCOs used in embodiments of the present invention.

Only ninety voltage steps are used out of the 156 steps available in resistor ladder 201. That is because only the highest ninety voltages are in the expected operating range of precision ammeter 104. Therefore, lower value voltages available from resistor ladder 201 can be ignored since power supply 105 is unlikely to provide such low voltages to CPU 101. It will be understood that in other embodiments, other voltage ranges or other numbers of calibration voltages may be used.

Micro-controller 102 stores table 20 and uses it as a reference to determine what voltages are being applied to VCOs 202–205 during system measurements. For example, when $VCO_1$ 202 is used to measure a voltage in CPU 101, micro-controller 102 monitors the output count of $VCO_1$ 202 for the same 8 microsecond sample period that is used during the calibration process. Micro-controller 102 compares the output count to the values in column 21 of table 20. The entry having the closest count to the measurement (for example, $COUNT1_n$) is identified in column 21, and the corresponding voltage (for example, $V_n$) is identified as the measured voltage. Micro-controller 102 may use voltage $V_n$ for any related calculations, such as current or power calculations. For further accuracy, micro-controller 102 interpolates between table entries to achieve higher voltage measurement accuracy than the resolution of the table. Using these techniques, the final accuracy of the voltage measurement is dominated by the accuracy of the reference voltage and the construction of the resistive ladder table.

Table 20 is not created all at one time. Instead, the calibration measurements are interleaved in time with other measurements that are performed by micro-controller 102. The values in calibration table 20 must be refreshed at a rate faster than the thermal time constant of system 100. If the thermal time constant is 60 milliseconds, for example, then the individual calibration measurements for table 20 can be made once every 60 ms. Micro-controller 102 observes the output of $VCO_1$ 202 in 8 millisecond increments. Ninety of these calibration samples are required to fill or update column 21 for $VCO_1$ 202. Because the calibration samples are spread among other the system measurements, each calibration sample occurs every 83 measurements. Therefore, it takes a total of 83 measurements/calibration sample×90 calibration samples/calibration cycle×8 microseconds/sample<=60 milliseconds to complete an entire calibration cycle and update all table entries. Accordingly, micro-controller 102 refreshes table 20 with new values every 60 milliseconds. This ensures that the values used to calculate the voltages for any measurements by VCOs 202–205 are never more than 60 milliseconds old and that they provide a high level of accuracy.

Micro-controller 102 uses a scheduler to control which measurements are made by VCOs 202–205. The scheduler is part of firmware 103 in micro-controller 102 and can be updated to adjust the frequency and order of the calibration measurements either to reflect improved algorithms, to fix bugs in earlier versions of the firmware, or to provide custom solutions for the user.

Precision ammeters 104 comprise VCOs 202–205 which are used to calculate and monitor the power being supplied to CPU cores 101. VCOs 202–205 may be alternatively linked to calibration voltages, resistive ladder 201, temperature sensors, sense resistors or other components using a switch network, such as multiplexer (not shown). Calibration current sources 107 (FIG. 1) are on-die current sources in parallel with CPU cores 101. In a preferred embodiment, calibration current sources 107 also provide current in parallel with a cache power grid (not shown). Micro-controller 102 can separately manage the core and cache current sources using the concepts disclosed herein. For purposes of the present disclosure, monitoring of the core current source will be used as an example.

Micro-controller 102 uses the parasitic resistance of the power grid itself to calculate the power that is supplied to the CPU core. However, this parasitic resistance varies with time and temperature. Therefore, the parasitic resistance, as well as the core current source, must be calibrated before micro-controller 102 can accurately calculate the CPU power level.

FIG. 3 is a schematic diagram of a current source calibration circuit. Circuit 31 consists of resistor $R_X$ 301 and on-die variable current source 302. VCO 303 and VCO 312 are coupled across resistor $R_X$ 301 and measure the voltage on either side of resistor $R_X$ 301. The difference between these measurements is voltage drop $V_X$ 304. Current $I_X$ 305 passing through resistor $R_X$ 301 is created by variable current source 302, which is a digital current source that accepts four-bit digital input signal 306.

Micro-controller 102 controls on-die current source 302 using four-bit input signal 306. Current source 302 generates a current flow in proportion to input signal 306. Micro-controller 102 adjusts signal 306 to vary current $I_X$ 305 that is generated by source 302. Micro-controller 102 also monitors VCO 303 and VCO 312 to determine voltage $V_X$ 304. VCO 303 and VCO 312 generate an output count difference proportional to voltage $V_X$ 304. Micro-controller 102 samples the output of VCO 303 and VCO 312 for 8 microseconds to get output counts. As discussed above, micro-controller 102 can compare those VCO output counts to a table, such as table 20 (FIG. 2), to identify corresponding input voltages. Then, micro-controller 102 computes the voltage difference. Using this feedback loop, micro-controller 102 sets the bits of signal 306 and monitors the output of VCO 303 and VCO 312 to determine the corresponding voltage $V_X$ 304 that is generated across resistor $R_X$ 301.

Micro-controller 102 adjusts bits $b_4$–$b_1$ of signal 306 to increase or decrease voltage $V_X$ 304. Resistor $R_X$ 301 is a precision resistance with a value known to micro-controller 102. Micro-controller 102 uses the known value of resistance RX 301 and the measured value of $V_X$ 304 to determine the value of current $I_X$ 305. This is accomplished using formula: $I_X = V_X/R_X$.

Circuit 32 is a calibration circuit for CPU core 101. On-die, variable current source $I_N$ 307 is controlled by a four-bit input signal 309 from micro-controller 102. Power supply 105 supplies current $I_{chip}$ 311 to CPU core 101 via a supply grid having resistance $R_{PACKAGE}$ 310. Current source 307 is used for the parasitic resistance calibration process, but does not supply the primary CPU current.

Current source 307 is proportional to on-die, variable current source 302. The FET transistors used to build current source $I_N$ 307 are the same as the FET transistors used to build current source 302 with the difference that the FET transistors in current source 307 are bigger. Therefore, when the same input signal 306, 309 is used for both current sources, the current $I_N$ 308 generated by current source 307 is proportionally larger than the current $I_X$ 305 generated by current source 302. A ratio "N" can be calculated between current source 302 and current source 307, wherein $I_N = I_X \times N$. As input signals 306, 309 are varied, current sources 302, 307 generate currents in which current $I_N$ 308 is always "N" times greater than the current $I_X$ 305 (i.e. $I_N = I_X \times N$).

For the calibration procedure, it is necessary to set current $I_N$ 308 to 16 Amperes. Although, micro-controller 102 does not measure current $I_N$ 308 directly, it can determine what setting to use for input signal 309 to cause current $I_N$ 308 to be 16 Amperes. Since current sources 302 and 307 are proportional, if micro-controller 102 sets current $I_X$ to 16/N, then $I_N$ 308 will be driven to 16 Amperes. An input 306 that generates this value of $I_X$ 305 (i.e. $I_X = 16/N$) will also generate an $I_N$ current of $I_X \times N = 16/N \times N = 16$ Amperes.

Micro-controller 102 may use a successive approximation scheme to determine the correct value for input 306. First, micro-controller 102 sets bits b4–b1 306 to a predetermined starting value, such as 1111, and calculates current $I_X$ 305 using the method discussed above. If current $I_X$ does not equal the desired value (i.e. 16/N Ampere), then micro-controller 102 determines if the value of $I_X$ 305 is high or low. If current $I_X$ 305 is too high, then micro-controller 102 turns bit b4 (306) off. If current $I_X$ 305 is too low, then micro-controller 102 leaves bit b4 (306) on. After evaluating and adjusting bit b4 (306), micro-controller 102 moves to bit b3 (306) and repeats the process—leaving bit b3 (306) on if current $I_X$ 305 is too low and turning bit b3 (306) off if current $I_X$ 305 is too high. This process is repeated for each of the four bits in input signal 306 until current $I_X$ 305 equals 16/N.

Micro-controller 102 may accomplish this operation in four steps. These measurements and adjustments can be spread over time and interleaved with other measurements so that VCO 303, VCO 312, and micro-controller 102 do not focus on calibration measurements at the expense of monitoring the VLSI environment.

Figure 4A:
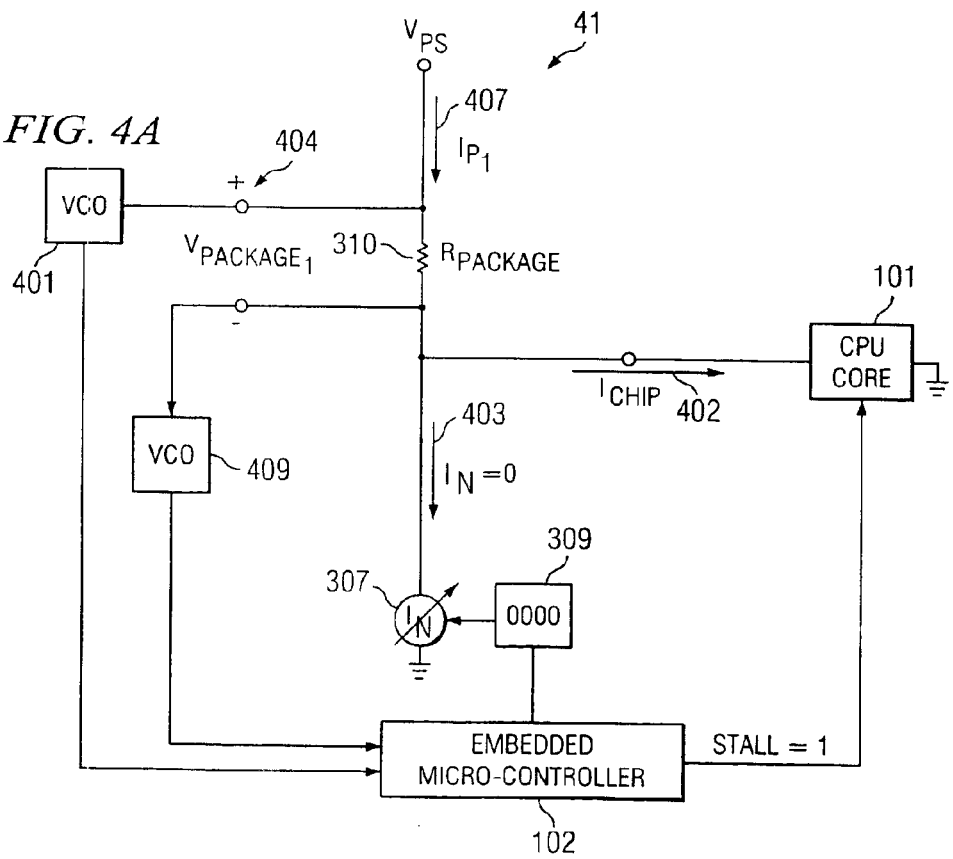
FIG. 4A illustrates the CPU current calibration process.

FIG. 4A illustrates the next step in the CPU current calibration process. Circuit 41 is the same as circuit 32 of FIG. 3 with additional components illustrated. VCO 401 and VCO 409, which may be VCO 303 and VCO 312 or any other precision ammeter, is coupled across the core power supply grid, which is represented by $R_{PACKAGE}$ 310. The present invention avoids the need to use a fixed parasitic resistance for power measurements. The use of such parasitic resistances elements wastes power. Instead, in the present system, the micro-controller calculates power using the "unavoidable" power loss within the power supply grid's own resistance.

In FIG. 4A, micro-controller 102 stalls CPU core 101 by putting it into a quiet state so that it draws a constant DC current designated in FIG. 4A as $I_{chip}$ 402. Alternatively, CPU core 101 may be scheduled to stall at intervals, and micro-controller 102 performs the calibration operations during these stall periods. Micro-controller 102 sends a zero input signal 309 to variable current source 307 so that $I_N = 0$ (403). As a result, all of the current for $I_{chip}$ 402 comes from the power supply across the package resistance $R_{PACKAGE}$ 310 as $I_{P1}$ 407. While circuit 41 is in this state, VCO 401 and VCO 409 sample the voltage across $R_{PACKAGE}$ and micro-controller 102 monitors the output counts from VCO 401 and VCO 409 performs a table look-up and takes the difference to determine the value of $V_{PACKAGE1}$ 404.

Figure 4B:
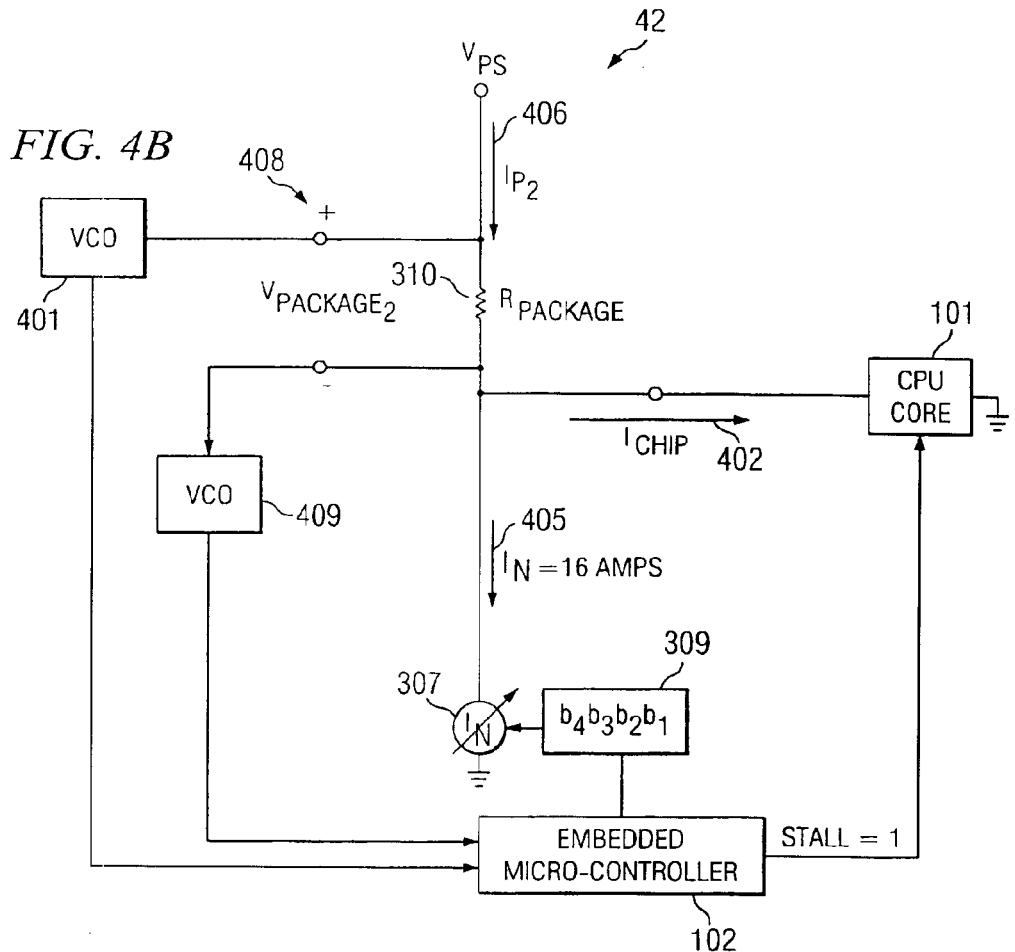
FIG. 4B illustrates another operation in the CPU current calibration process.

Then, as illustrated in FIG. 4B, micro-controller 102 turns on variable current source 307 by applying input signal 309, which, as discussed with respect to FIG. 3 above, is selected to force current $I_N$ (406) to 16 Amperes. As a result, the current from the power supply across $R_{PACKAGE}$ 310 is $I_{CHIP}$ (402)+$I_N$ (405)=$I_{CHIP}$+16 Amperes. Micro-controller 102 again measures the voltage drop across $R_{PACKAGE}$ 310 using VCO 401 and VCO 409 to calculate $V_{PACKAGE2}$ 408.

Following these two sets of measurements, micro-controller 102 has two values of $V_{PACKAGE}$, one at current $I_{P1}$ 407 ($V_{PACKAGE1}$ 404), and one at current $I_{P2}$ 406 ($V_{PACKAGE2}$ 408).

Current $I_{P1}$ (407)=$I_{CHIP}$, and current $I_{P2}$ (406)=$I_{CHIP}$+16 Amperes. The value of $R_{PACKAGE}$ 310 can be calculated using these measurements, wherein $R_{PACKAGE} = \Delta V_{PACKAGE}/\Delta I_{PACKAGE} = (V_{PACKAGE2} - V_{PACKAGE1})/(I_{P2} - I_{P1}) = (V_{PACKAGE2} - V_{PACKAGE1})/(I_{CHIP} + 16 \text{ Amperes} - I_{CHIP}) = (V_{PACKAGE2} - V_{PACKAGE1})/16$ Amperes.

Micro-controller 102 uses the above-illustrated formula along with the two measured values of $V_{PACKAGE}$ to calculate $R_{PACKAGE}$. Once $R_{PACKAGE}$ is known, micro-controller 102 turns off current source 307 (i.e. $I_N=0$), releases the stall to CPU core 101, and CPU core 101 again goes active, which typically will cause $I_{CHIP}$ 402 to increase as the CPU power increases.

Using the new measurements of $V_{PACKAGE}$ from VCO 401 and VCO 409 along with the known $R_{PACKAGE}$ value, micro-controller 102 can calculate $I_{CHIP}=V_{PACKAGE}/R_{PACKAGE}$ at any time during CPU operation. This value can be used to determine the CPU's power level=$V_{409}*(V_{401}-V_{409})/R_{PACKAGE}$.

The VCOs, current sources, and package resistance change over time due to age, temperature, operating voltage and other factors. Therefore, micro-controller 102 must constantly recalibrate the values used in its calculations. The calibration measurements may be repeated at scheduled intervals, as discussed above. As a result, the calibration can run continuously in the background, thereby ensuring that micro-controller 102 has accurate information to evaluate and adjust the VLSI environment. In addition, the CPU core 101 must only be stalled periodically with minimal impact to CPU performance.

FIG. 5 is a flowchart illustrating a three-level process for calibrating measurements in a large VLSI CPU. At 501, a VCO calibration process starts. VCOs are used to measure voltages on the CPU die. In response to an input voltage, the VCOs output a series of pulses. The pulses count over a set period of time is proportional to the input voltage. A series of calibration voltages are provided at 502 using a resistor ladder that is constructed on the CPU die. The resistors have identical values and create an evenly spaced voltage drops between each resistor in the ladder. Known voltages can be tapped from the resistance ladder. In block 503, a known voltage from the resistance ladder is applied to the VCO input.

The voltage input causes the VCO to output a stream of pulses, which are counted in 504 over a set period of time, which may be, for example, a 8 microsecond sample window. In 505, a calibration table is created or, if it already exists, updated with the values observed in 504. The table consists of a list of the observed VCO output count for each known voltage input to the VCO. In 506, the VCO calibration processes loops back to 503 where another input voltage is input to the VCO. The process continues through 503–506 and loops back until all of the desired input calibration voltages have been used. Once the calibration table is full and updated, the current source calibration starts at 507. These calibration steps are dispersed in time to minimize the impact and latency incurred on micro-controller 102's duty of monitoring and controlling the VLSI environment.

Two current sources are required for the calibration process. In 508, the two current sources are proportional to each other, however, one generates a proportionally larger current level. A ratio "N" represents the difference between the two current sources. In 509, a target current level is identified for the first current source. The goal of the current source calibration process is to set the second current source to 16 Amperes. Accordingly, the target current level for the first current source is 16/N Amperes.

The variable current sources have a digital input comprising a four-bit signal. The current output is varied by adjusting the input bits. The higher the value of the four-bit input, the higher the output current level. In 510, a four-bit input signal is applied to the first current source generating a current flow through a known resistance value. In 511, the previously calibrated VCO is used to measure the voltage drop across the known resistance. The output count of the VCO is sampled and compared to the VCO calibration table to determine the voltage drop. In 512, the measured voltage and known resistance are used to calculate the current generated for the four-bit input signal.

The calculated current draw is compared to the desired current (i.e. 16/N Amperes), in 513. If the present four-bit input does not provide the desired current out of the first current source, then the bits of the input signal are adjusted in 514, and the process loops back to 510 to measure the new current from the first current source. The input bits may be adjusted one-by-one, wherein, if the current level is too high, then the first bits is changed from a "1" to a "0" and the current is reevaluated by looping through 510–513. The process is repeated for each bit and after four passes, all the bits are adjusted. The final input signal that is used to generate a current of 16/N Amperes in the first current source will generate a current of 16 Amperes if applied to the second current source. Again, these four calibration steps may be dispersed in time similar to the ninety VCO calibration steps such that all of these steps have been completed within 60 ms. Note that these four steps must be done after the ninety VCO calibration steps, however.

Once the current source has been calibrated, then the process moves to the conductance calibration at 515. The goal of the conductance calibration is to measure the inherent conductance or resistance in the power supply grid. This inherent conductance or resistance may come from the power supply lines that are connected from the power supply to the CPU die, for example.

In 516, the CPU cores are stalled and put into a quiet state having a steady-state current draw from the power supply. In 517, a first voltage measurement is taken using the calibrated VCO. The voltage measurement is taken across the unknown inherent resistance which is passing the steady-state current that is drawn by the stalled CPU core.

In 518, using the input selected in the current source calibration, the second current source is turned on. The current drawn by the second current source is known to be 16 Amperes and, therefore, increases the current through the inherent resistance by 16 Amperes. In 519, a second voltage measurement is made across the still-unknown inherent resistance. The current draw through the inherent resistance is 16 Ampere plus the stalled CPU current.

In 520, the inherent resistance can be calculated using the two voltage measurements. Using Ohm's Law, the resistance is equal to voltage/current=$\Delta V/\Delta I$. The $\Delta I$ between the two measurements is known to be the 16 Amperes added by the second current source. The $\Delta V$ can be calculated by subtracting one voltage measurement from the other.

Once the inherent resistance is calculated in 520, the resistance can be used to calculate the current and power drawn by the CPU core under any operating conditions. Accordingly, the CPU core is released from the stalled condition in 521 and returns to operation. In 522, the calibrated VCO is used to measure the voltage drop across the known inherent resistance. These values can be used in 523 to calculate the instantaneous current (I=Vdrop/R) and power (V*Vdrop/R) for the CPU core. The current and power measurements can be used by a CPU core micro-controller, for example, to optimize the CPU's operating environment. The calculations can be done throughout the next 60 ms interval interleaved with the necessary calibration steps during that interval. For example, a calibration (or recalibration) cycle can be completed in 60 ms and, during that time, the value of the inherent resistance calculated during the previous calibration cycle is used for power measurements. During each 60 ms calibration cycle approximately 98.7% of the measurements by the VCOs are power and temperature measurements and approximately 1.3% of the measurements are for calibration.

In 524, the process returns to 501 to recalibrate the VCOs, the current sources and to re-measure the inherent resistance. Because the components are sensitive to temperature, voltage, drift and other factors, they must be continuously recalibrated to ensure that accurate measurements are being made.

Figure 6:
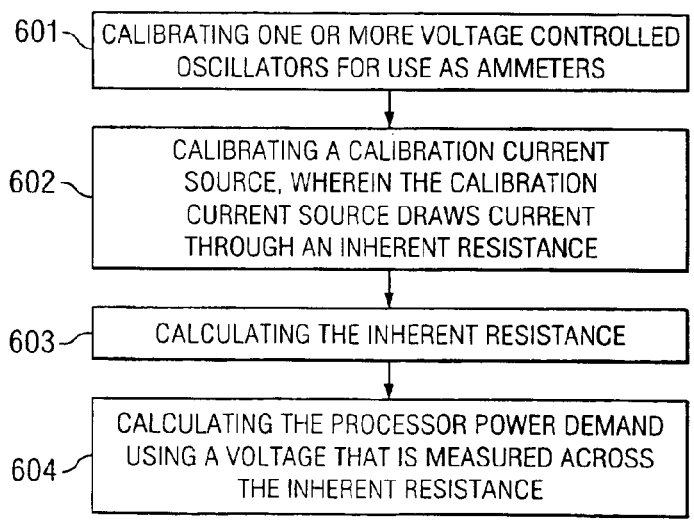
FIG. 6 is a flow chart illustrating an embodiment of the present invention.

FIG. 6 is a flow chart illustrating an embodiment of the present invention. The flowchart illustrates a method for measuring integrated circuit processor power demand. At 6001, one or more VCOs are calibrated for use as ammeters. At 602, a calibration current source is calibrated. The calibration current source draws current through an inherent resistance. At 603, the inherent resistance is calculated. Finally, at 604, the processor power demand is calculated using a voltage that is measured across the inherent resistance.

What is claimed is:

1. A method for measuring integrated circuit processor power demand comprising:
    calibrating one or more voltage controlled oscillators (VCOs) for use as ammeters;
    calibrating a calibration current source, wherein the calibration current source draws current through an inherent resistance;
    calculating the inherent resistance; and
    calculating the processor power demand using a voltage that is measured across the inherent resistance.

2. The method of claim 1 wherein calibrating one or more VCOs further comprises:
    providing a resistive ladder having a plurality of voltage taps;
    applying voltages from selected ones of the voltage taps to each of the VCOs;
    monitoring an output count from the VCO over a set period; and
    storing, for each VCO, a table of output counts for each voltage.

3. The method of claim 2 wherein the plurality of voltage taps are known, evenly spaced voltages.

4. The method of claim 2 further comprising:
    interleaving a VCO calibration cycle with other VCO measurements.

5. The method of claim 1 wherein calibrating a calibration current source further comprises:
    providing a first variable current source and a second variable current source, wherein the second current source outputs more current than the first current source by a scaling factor;
    identifying a target current level for the first current source, wherein the target current source is equal to a calibration current divided by the scaling factor;
    applying an input to the first current source;
    comparing an output current of the first current source to the target current level;
    if the output current does not equal the target current level, adjusting the first current source input until the first current source output current is acceptable; and
    storing the value of the first current source input that produces the acceptable output current.

6. The method of claim 5 wherein the calibration current is 16 Amperes.

7. The method of claim 5 wherein the input to the first current source is a four-bit signal, and wherein the bits are individually adjusted to change the first current source output current.

8. The method of claim 5 wherein the input to the first current source is a first four-bit signal and the input to the second current source is a second four-bit signal, and wherein when the same four-bit number is used for both the first and second current source inputs, the ratio of the second current source output current to the first current source output current is the scaling factor.

9. The method of claim 1 wherein calculating an inherent resistance further comprises:
    stalling operations in cores of the processor;
    measuring a first calibration voltage across the inherent resistance, while the second current source is off;
    measuring a second calibration voltage across the inherent resistance, while the second current source is on and drawing a known current; and
    calculating the inherent resistance using the difference between the first and second calibration voltage and the known voltage.

10. The method of claim 9 wherein a first calibration current through the inherent resistance is a current drawn by the stalled processor while the second current source is off; and
    wherein a second calibration current through the inherent resistance is a current drawn by the stalled processor while the second current is on.

11. The method of claim 9 wherein the inherent resistance is a resistance in the power supply grid to the processor integrated circuit.

12. The method of claim 9 wherein the known current is 16 Amperes.

13. The method of claim 9 further comprising:
    releasing the processor from a stalled state;
    measuring the voltage across the inherent resistance while the processor is operating; and
    calculating an operating power level for the processor.

14. The method of claim 1 further comprising:
    repeating the calibration operations at periodic intervals to compensate for variations caused by temperature, operating voltage and/or age of the processor integrated circuit.

15. The method of claim 1 further comprising:
    interleaving the calibration operations with measurement operations.

16. The method of claim 15 wherein a calibration cycle is completed within a thermal time constant of the processor integrated circuit.

17. A system for calibrating measurements in a processor integrated circuit die, comprising:
    at least one voltage controlled oscillator (VCO);
    a resistive ladder having a plurality of voltage taps, wherein the voltage taps are connectable to the VCO; and
    a controller coupled to the output of the VCO, wherein the controller maintains a calibration table of VCO output counts for selected voltage inputs;
    wherein the at least one VCO, the resistive ladder and the controller are constructed on the same die as the processor integrated circuit.

18. The system of claim 17 further comprising:
    a first variable current source having a first input controlled by the controller; and a second variable current source having a second input controlled by the controller;

wherein, when a same signal is applied to the first and second inputs, the output of the second current source is greater than the output of the first current source by a scaling factor.

19. The system of claim 18 wherein the first and second variable current sources are constructed on the same die as the processor integrated circuit.

20. The system of claim 18 further comprising:

a known resistance coupled to the first variable current source; and an inherent resistance coupled to the second variable current source.

21. The system of claim 20 wherein the VCO is coupled across the inherent resistance, thereby allowing the controller to measure a voltage drop across the inherent resistance.

22. A computer program product comprising a computer usable medium having computer readable program code embedded therein, the computer readable program code comprising:

code for calibrating one or more voltage controlled oscillators for use as ammeters;

code for calibrating a calibration current source, wherein the calibration current source draws current through a inherent resistance;

code for calibrating the inherent resistance; and code for calculating the processor integrated circuit power demand using a voltage that is measured across the inherent resistance.

23. The computer program product of claim 22 wherein the code for calibrating one or more VCOs further comprises:

code for applying voltages from selected voltage taps on a resistive ladder to each of the VCOs;

code for monitoring an output count from the VCO over a set period; and code for storing, for each VCO, a table of output counts for each voltage.

24. The computer program product of claim 23 further comprising: code for interleaving a VCO calibration cycle with other VCO measurements.

25. The computer program product of claim 22 wherein the code for calibrating a calibration current source further comprises:

code for providing a first variable current source and a second variable current source, wherein the second current source outputs more current than the first current source by a scaling factor;

code for identifying a target current level for the first current source, wherein the target current source is equal to a calibration current divided by the scaling factor;

code for applying an input to the first current source;

code for comparing an output current of the first current source to the target current level;

code for determining if the output current does not equal the target current level and for adjusting the first current source input until the first current source output current is acceptable; and code for storing the value of the first current source input that produces the acceptable output current.

26. The computer program product of claim 25 wherein the input to the first current source is a first four-bit signal and the input to the second current source is a second four-bit signal, and wherein when the same four-bit number is used for both the first and second current source inputs, the ratio of the second current source output current to the first current source output current is the scaling factor.

27. The computer program product of claim 22 wherein the code for calibrating a inherent resistance further comprises:

code for stalling operations in cores of the processor;

code for measuring a first calibration voltage across the inherent resistance, while the second current source is off;

code for measuring a second calibration voltage across the inherent resistance, while the second current source is on and drawing a known current; and code for calculating the inherent resistance using the difference between the first and second calibration voltage and the known voltage.

28. The computer program product of claim 27 wherein a first calibration current through the inherent resistance is a current drawn by the stalled processor while the second current source is off; and wherein a second calibration current through the inherent resistance is a current drawn by the stalled processor plus the known current.

29. The computer program product of claim 22 further comprising:

code for releasing the processor from a stalled state;

code for measuring the voltage across the inherent resistance while the processor is operating; and code for calculating an operating power level for the processor integrated circuit.

30. A system for measuring integrated circuit processor power demand comprising:

means for calibrating one or more voltage controlled oscillators (VCOs) for use as ammeters;

means for calibrating a calibration current source, wherein the calibration current source draws current through an inherent resistance;

means for calculating the inherent resistance; and means for calculating the processor power demand using a voltage that is measured across the inherent resistance.

31. The system of claim 1 further comprising:

a resistive ladder having a plurality of voltage taps;

means for applying voltages from selected ones of the voltage taps to each of the VCOs;

means for monitoring an output count from the VCO over a set period; and means for storing, for each VCO, a table of output counts for each voltage.

32. The system of claim 30 wherein the means for calibrating a calibration current source further comprises:

means for providing a first variable current source and a second variable current source, wherein the second current source outputs more current than the first current source by a scaling factor;

means for identifying a target current level for the first current source, wherein the target current source is equal to a calibration current divided by the scaling factor;

means for applying an input to the first current source;

means for comparing an output current of the first current source to the target current level;

means for adjusting the first current source input until the first current source output current is acceptable, if the output current does not equal the target current level; and means for storing the value of the first current source input that produces the acceptable output current.

33. The system of claim 30 wherein the means for calculating an inherent resistance further comprises:

means for stalling operations in cores of the processor;

means for measuring a first calibration voltage across the inherent resistance, while the second current source is off;

means for measuring a second calibration voltage across the inherent resistance, while the second current source is on and drawing a known current; and means for calculating the inherent resistance using the difference between the first and second calibration voltage and the known voltage.

34. The system of claim 33 further comprising:

means for releasing the processor from a stalled state;

means for measuring the voltage across the inherent resistance while the processor is operating; and means for calculating an operating power level for the processor.

* * * * *